(12) United States Patent
Tao et al.

(10) Patent No.: US 11,329,034 B2
(45) Date of Patent: May 10, 2022

(54) DIRECT-BONDED LED STRUCTURE CONTACTS AND SUBSTRATE CONTACTS

(71) Applicant: Invensas Corporation, San Jose, CA (US)

(72) Inventors: Min Tao, San Jose, CA (US); Liang Wang, Newark, CA (US); Rajesh Katkar, Milpitas, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 105 days.

(21) Appl. No.: 16/840,245

(22) Filed: Apr. 3, 2020

(65) Prior Publication Data

US 2020/0235085 A1     Jul. 23, 2020

Related U.S. Application Data

(63) Continuation of application No. 15/919,570, filed on Mar. 13, 2018, now Pat. No. 10,629,577.
(Continued)

(51) Int. Cl.
*H01L 21/18*     (2006.01)
*H01L 25/16*     (2006.01)
(Continued)

(52) U.S. Cl.
CPC ...... *H01L 25/167* (2013.01); *H01L 21/02118* (2013.01); *H01L 21/3212* (2013.01);
(Continued)

(58) Field of Classification Search
CPC ......... H01L 21/187; H01L 2224/80894; H01L 2224/80895; H01L 2224/82895;
(Continued)

(56) References Cited

U.S. PATENT DOCUMENTS 7,614,771 B2   11/2009   McKechnie et al.
7,736,945 B2   6/2010   Schiaffino et al.
(Continued)

OTHER PUBLICATIONS

International Search Report and Written Opinion, dated Jun. 29, 2018 in PCT Application No. PCT/US2018/022199, 17 pages.

*Primary Examiner* — Hoai V Pham
(74) *Attorney, Agent, or Firm* — Lee & Hayes, P.C.

(57) ABSTRACT

Direct-bonded LED arrays and applications are provided. An example process fabricates a LED structure that includes coplanar electrical contacts for p-type and n-type semiconductors of the LED structure on a flat bonding interface surface of the LED structure. The coplanar electrical contacts of the flat bonding interface surface are direct-bonded to electrical contacts of a driver circuit for the LED structure. In a wafer-level process, micro-LED structures are fabricated on a first wafer, including coplanar electrical contacts for p-type and n-type semiconductors of the LED structures on the flat bonding interface surfaces of the wafer. At least the coplanar electrical contacts of the flat bonding interface are direct-bonded to electrical contacts of CMOS driver circuits on a second wafer. The process provides a transparent and flexible micro-LED array display, with each micro-LED structure having an illumination area approximately the size of a pixel or a smallest controllable element of an image represented on a high-resolution video display.

23 Claims, 11 Drawing Sheets

Related U.S. Application Data (60) Provisional application No. 62/472,363, filed on Mar. 16, 2017.

(51) Int. Cl.
| | | |
|---|---|---|
| *H01L 33/00* | (2010.01) | |
| *H01L 25/10* | (2006.01) | |
| *H01L 27/12* | (2006.01) | |
| *H01L 27/15* | (2006.01) | |
| *H01L 25/18* | (2006.01) | |
| *H01L 21/321* | (2006.01) | |
| *H01L 21/02* | (2006.01) | |
| *H01L 23/00* | (2006.01) | |
| *H01L 33/06* | (2010.01) | |
| *H01L 33/32* | (2010.01) | |
| *H01L 33/44* | (2010.01) | |
| *H01L 33/46* | (2010.01) | |
| *H01L 33/62* | (2010.01) | |

(52) U.S. Cl.
CPC .............. *H01L 24/08* (2013.01); *H01L 24/80* (2013.01); *H01L 25/105* (2013.01); *H01L 25/18* (2013.01); *H01L 27/1214* (2013.01); *H01L 27/156* (2013.01); *H01L 33/007* (2013.01); *H01L 33/0093* (2020.05); *H01L 33/06* (2013.01); *H01L 33/32* (2013.01); *H01L 33/44* (2013.01); *H01L 33/46* (2013.01); *H01L 33/62* (2013.01); *H01L 2224/08145* (2013.01); *H01L 2224/80013* (2013.01); *H01L 2224/80355* (2013.01); *H01L 2224/80357* (2013.01); *H01L 2933/0016* (2013.01); *H01L 2933/0025* (2013.01); *H01L 2933/0066* (2013.01)

(58) Field of Classification Search
CPC . H01L 2224/82896; H01L 2224/83894; H01L 2224/83895; H01L 2224/84895; H01L 2224/84897; H01L 2224/8583; H01L 2224/85895; H01L 2224/85897; H01L 2224/86895; H01L 2224/86896
See application file for complete search history.

(56) References Cited

U.S. PATENT DOCUMENTS

| | | |
|---|---|---|
| 8,211,722 B2 | 7/2012 | Lu et al. |
| 8,865,489 B2 | 10/2014 | Rogers et al. |
| 8,929,077 B2 | 1/2015 | Gouramanis |
| 9,711,694 B2 | 7/2017 | Robin et al. |
| 9,847,458 B2 | 12/2017 | Lee et al. |
| 9,960,152 B2 | 5/2018 | Bono et al. |
| 2007/0096130 A1 | 5/2007 | Schiaffino et al. |
| 2009/0009103 A1 | 1/2009 | McKechnie et al. |
| 2010/0317132 A1 | 12/2010 | Rogers et al. |
| 2011/0294242 A1 | 12/2011 | Lu |
| 2013/0009183 A1 | 1/2013 | Han |
| 2013/0170145 A1 | 7/2013 | Gouramanis |
| 2015/0021626 A1 | 1/2015 | Nakamura et al. |
| 2016/0027765 A1* | 1/2016 | von Malm .......... H01L 23/5386 257/72 |
| 2016/0141469 A1 | 5/2016 | Robin et al. |
| 2016/0181477 A1 | 6/2016 | Lee et al. |
| 2017/0148777 A1 | 5/2017 | Bono et al. |
| 2020/0194614 A1 | 6/2020 | Pares |
| 2020/0194635 A1 | 6/2020 | Yuasa et al. |

* cited by examiner

DIRECT-BONDED LED STRUCTURE CONTACTS AND SUBSTRATE CONTACTS

RELATED APPLICATIONS

This divisional patent application claims the benefit of priority to U.S. patent application Ser. No. 15/919,570 to Tao et al., filed Mar. 13, 2018, which in turn claims priority to U.S. Provisional Patent Application No. 62/472,363 to Tao et al., entitled "Direct Bonded LED Arrays and Applications," filed Mar. 16, 2017, each of these and incorporated by reference herein, in their entirety.

BACKGROUND

MicroLEDs, also known as micro-LEDs, µLEDs, and "mLEDs" as used herein, are gaining significant attraction as an emerging flat panel display technology. But as of yet, mLED displays have not been mass-produced or commercialized widely. The mLED displays are arrays of microscopic LEDs forming individual pixel elements. Compared to the widespread LCD technology, mLED displays provide greater contrast and faster response times, while using less energy.

Along with organic light-emitting diodes (OLEDs), in which a film of organic compound is stimulated to emit electroluminescence, mLEDs can be used in small low-energy devices such as smart phones and smart watches, where battery power is at a premium.

Both mLEDs and OLEDs require less energy than conventional LCD systems. Unlike OLEDs, however, the mLED technology utilizes conventional III-V inorganic semiconductor materials (GaN, InGaN, etc.) for use as self-emissive LEDs for lighting and display, which can offer higher overall brightness (e.g., 30× over OLEDs) and higher contrast than OLED products, with higher efficiency in lux per watt (lux/W) light output. The mLED technology can also provide a longer working life for the product that is hosting the mLED technology. Versions of this mLED array technology may be ideal for automotive, virtual reality, and augmented reality displays.

SUMMARY

Direct-bonded LED arrays and applications are provided. An example process fabricates a LED structure that includes coplanar electrical contacts for p-type and n-type semiconductors of the LED structure on a flat bonding interface surface of the LED structure. The coplanar electrical contacts of the flat bonding interface surface are direct-bonded to electrical contacts of a driver circuit for the LED structure. In a wafer-level process, micro-LED structures are fabricated on a first wafer, including coplanar electrical contacts for p-type and n-type semiconductors of the LED structures on the flat bonding interface surfaces of the wafer. At least the coplanar electrical contacts of the flat bonding interface are direct-bonded to electrical contacts of CMOS driver circuits on a second wafer. The process provides a transparent and flexible micro-LED array display, with each micro-LED structure having an illumination area approximately the size of a pixel or a smallest controllable element of an image represented on a high-resolution video display.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DESCRIPTION

This disclosure describes example direct-bonded light emitting diode (LED) arrays and applications. New processes for forming actively driven mLED (microLED) structures and display cells are described, including example processes of array-bonding III-V compound semiconductor mLEDs to silicon driver chips to form actively driven mLED display cells. Some of these processes may be used to mass-produce mLED array displays.

Example Processes and Structures

Figure 1:
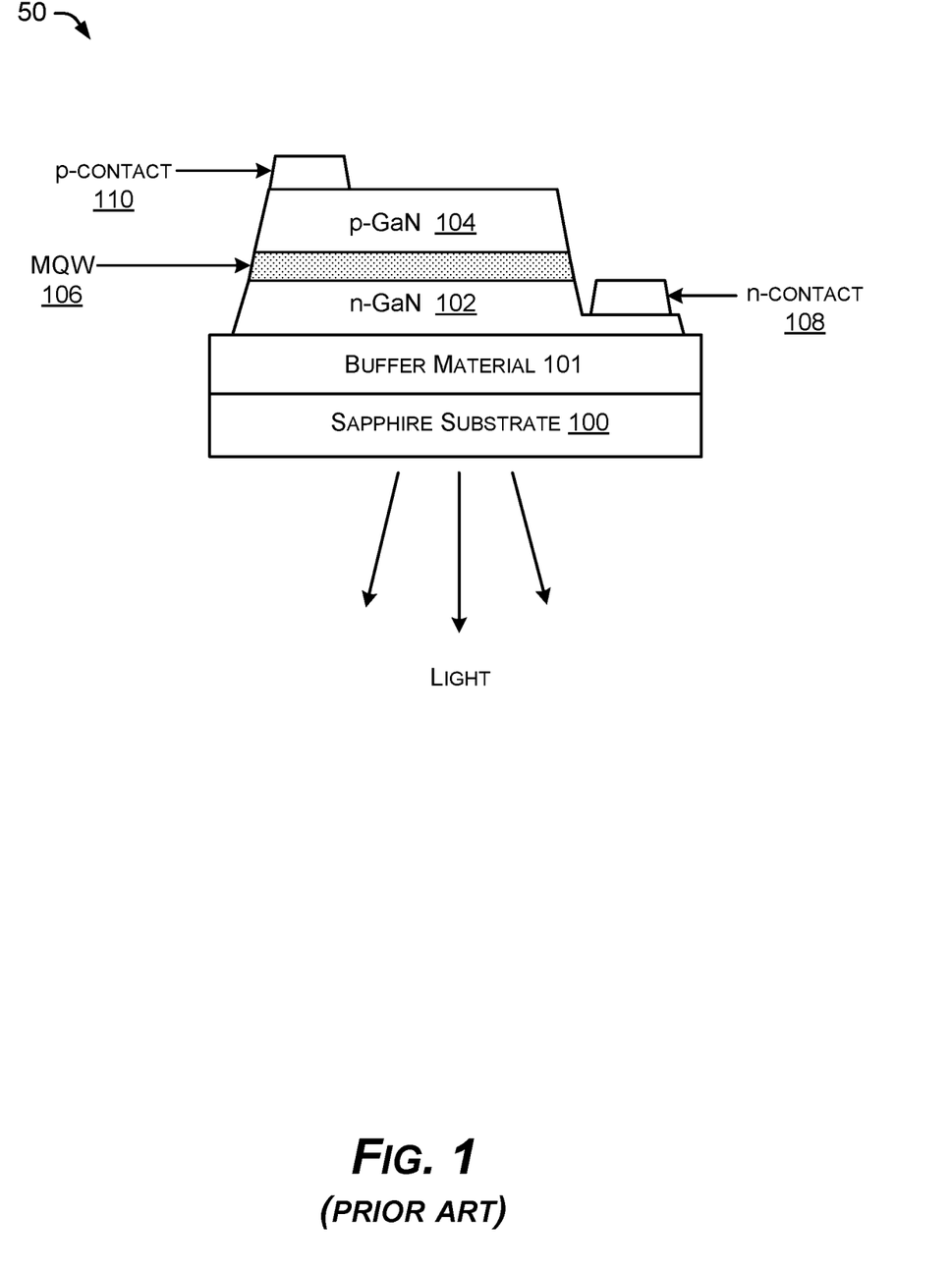
FIG. 1 is a diagram of an example conventional nitride light emitting diode (LED).

FIG. 1 shows an example of a conventional epilayer structure 50 of a light emitting diode (LED) over a sapphire substrate 100, illustrating and comparing some LED components used in example structures and processes described herein. The example conventional LED structure 50 may produce green or blue light, for example. Semiconductor materials are layered on a carrier, such as a sapphire substrate 100. The large mismatches in lattice constants and thermal expansion coefficients between GaN and sapphire 100 would cause high crystalline defect densities in the GaN films, which leads to degradation of device performance; hence a lattice and CTE matched buffer material 101 is deposited on sapphire 100 to grow GaN. Optoelectronic devices like the conventional LED structure 50 utilize semiconductor doping, for example, a small amount of silicon or germanium is added to gallium nitride (GaN) to make the GaN a conductor for electrons (n-type) n-GaN 102, and a small amount of magnesium is added to the gallium nitride (GaN) to make the GaN into a conductor for holes (electron holes) (p-type) p-GaN 104. Between the layer of n-GaN 102 and the layer of p-GaN 104 is sandwiched an ultrathin layer of a light-producing quantum well or multiple quantum well (MQW) material, that has a smaller band gap (and slightly less conductivity) than either the n-GaN 102 and the p-GaN 104, such as indium gallium nitride InGaN, a semiconductor material made of a mix of gallium nitride (GaN) and indium nitride (InN). InGaN is a ternary group III/group V direct band gap semiconductor. The example InGaN/GaN or InGaN MQW layer 106 provides quantum confinement, or discrete energy subbands, in which the carriers can have only discrete energy values, providing better performance in optical devices. Conventional LED structures 50 may have many variations in the number or layers used, and the materials used for each layer. In FIG. 1, the layers, and especially the MQW layer 106, are not shown to relative scale.

The example conventional LED structure 50 is characterized by an n contact 108 and a p contact 110 at different vertical levels on different surfaces of the conventional LED structure 50. The difference in vertical heights between p contact 110 and n contact 108 is conventionally compensated for by wire bond or solder connections. Or, an example conventional structure 50 may have an n contact 108 that is not exposed (not shown).

Figure 2:
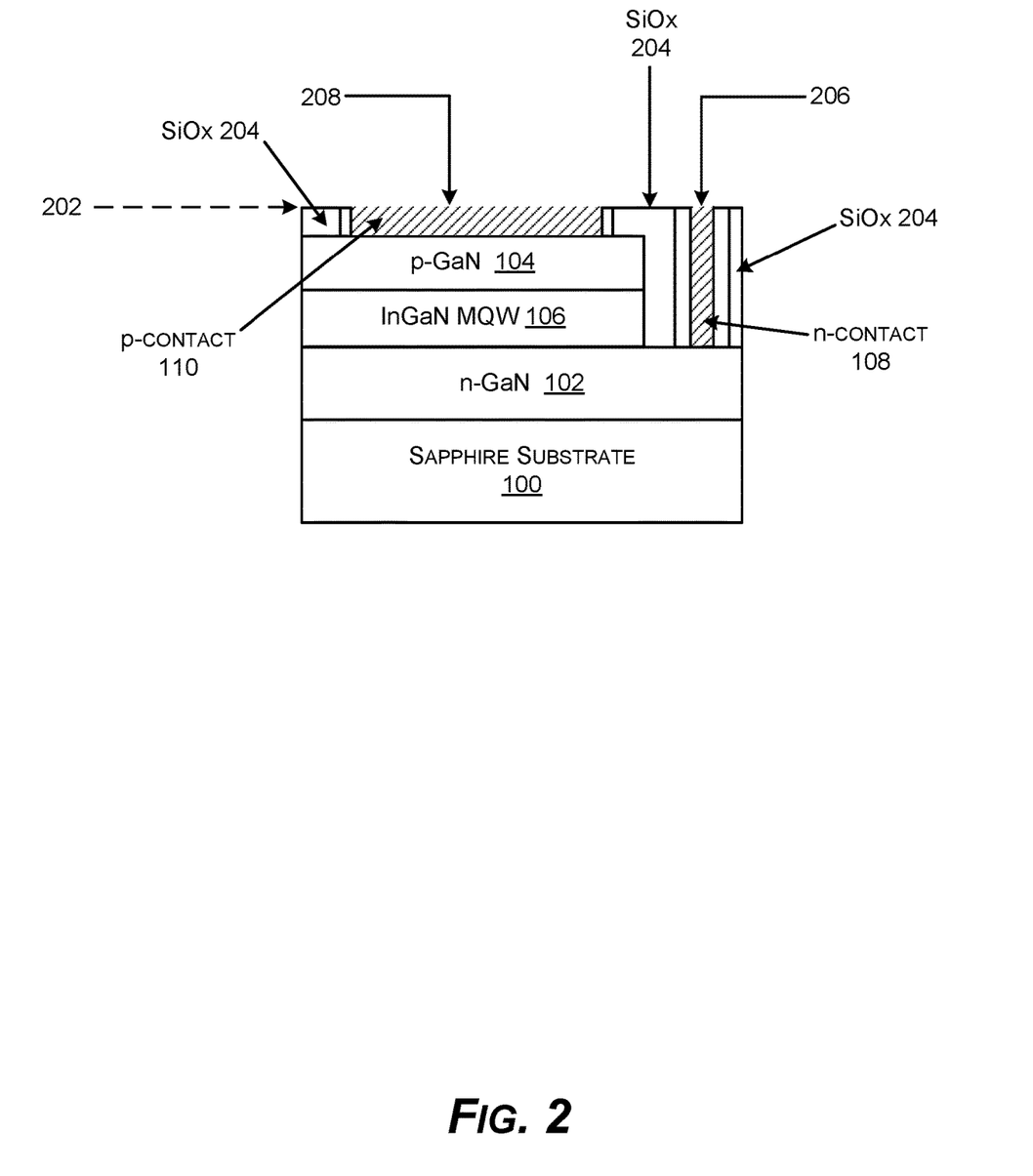
FIG. 2 is a diagram of an example LED structure suitable for direct-bonding of electrical contacts enabling wafer level, chip array-level, and individual chip-level construction of direct-bonded micro-LED structures.
Figure 3:
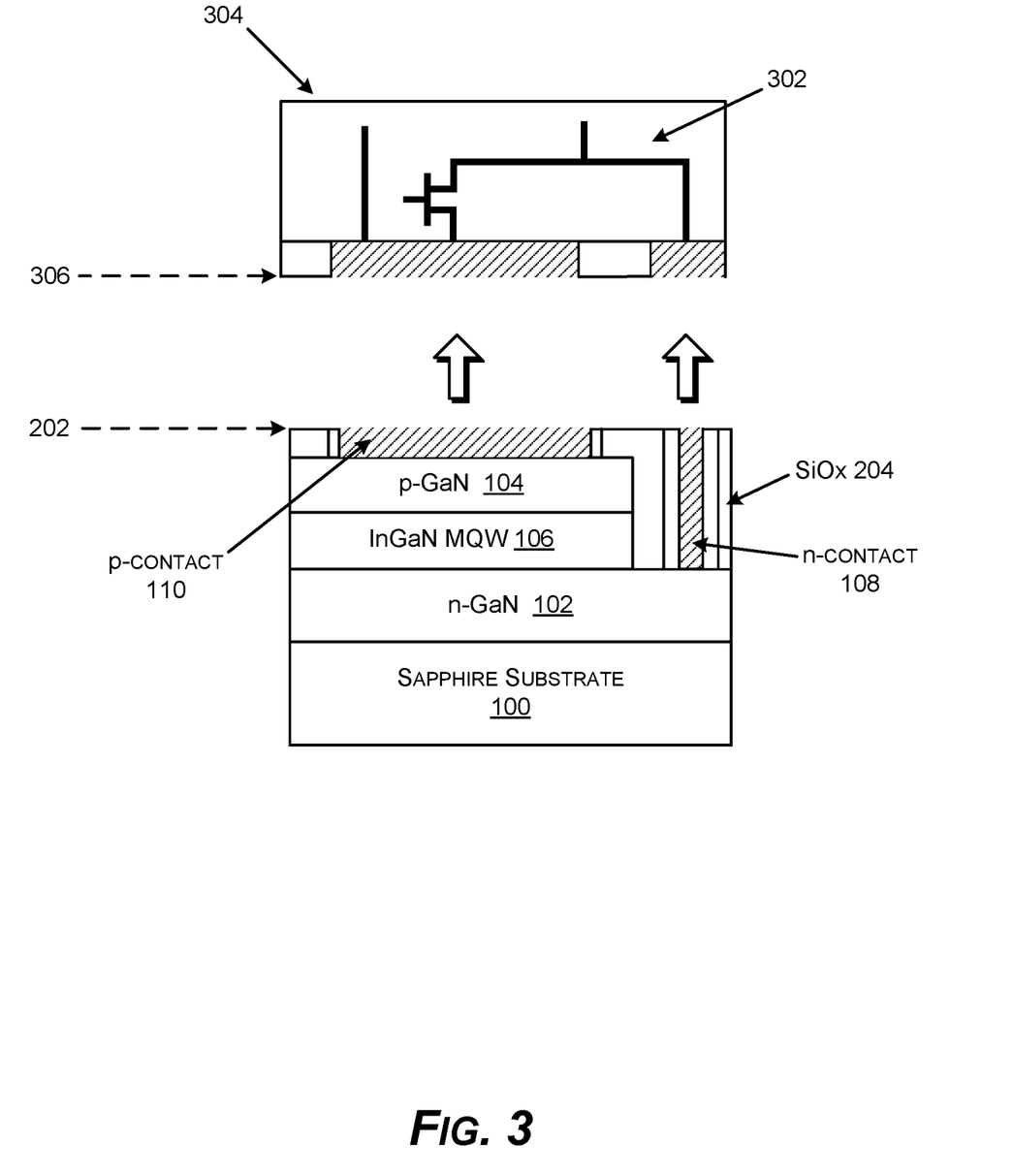
FIG. 3 is a diagram of the example LED structure of FIG. 2, in a direct-bonding operation with driver circuitry.

FIGS. 2-3 show an example LED structure 200 and process overview, for direct-bonding LED components containing III-V semiconductor elements to driver circuitry, for making mLED array displays. The example LED structure 200 provides an ultra-flat bonding interface 202, made flat by chemical-mechanical polishing (CMP) for example, with both n contact 108 and p contact 110 surrounded by an insulator 204, such as a silicon oxide, and exposed on the ultra-flat bonding interface 202 with respective coplanar conductive footprints 206 & 208 on the ultra-flat bonding interface 202.

The n contact 108 and p contact 110 may be made of a metal, or combination of alloyed metals, or laminated metals that enhance direct bonding. Besides metal composition, the ultra-flat bonding interface 202 itself also facilitates direct bonding between the n and p contacts 108 & 110 and respective conductive surfaces being bonded to. The ultra-flat bonding interface 202 fabricated by damascene methods, for example, is also ultra-clean, and flat within a few tens of nanometers, such as less than ¼ the wavelength of an illumination source of monochromatic green light at the 546.1 nm or helium-neon red laser light at 632.8 nm. In some embodiments the roughness of the flat polished surface 202 is less than 5% of the wavelength of an illumination source and preferably less than 10 nm.

FIG. 3 shows an example direct-bonding process 300 between the example LED structure 200 of FIG. 2, and a driver circuit 302 on a chip 304, to form LED circuitry, such as thin-film transistor (TFT) drivers. The example direct-bonding process 300 can be performed at the level of individual chips, or at a chip array level, or at wafer level. For subsequent lift-off and thinning, wafer level direct-bonding may be the best approach.

In an implementation, the mLED ultra-flat bonding interface 202 can be bonded to the respective ultra-flat bonding interface 306 of a silicon-based driver integrated circuit (IC) 304, for example. The ultra-flat bonding interface 306 may have a contacting surface that is topped with a flat silicon oxide layer and copper (Cu) pads to facilitate direct-bonding, for example direct-bonding via a ZiBond® brand process or a DBI® brand process, to form LED circuitry (Xperi Corporation, San Jose, Calif.). In an implementation, the sapphire substrate 100 may then be laser-lifted off. If desirable, both top and bottom sides can be thinned further to make the entire stack flexible.

Figure 4:
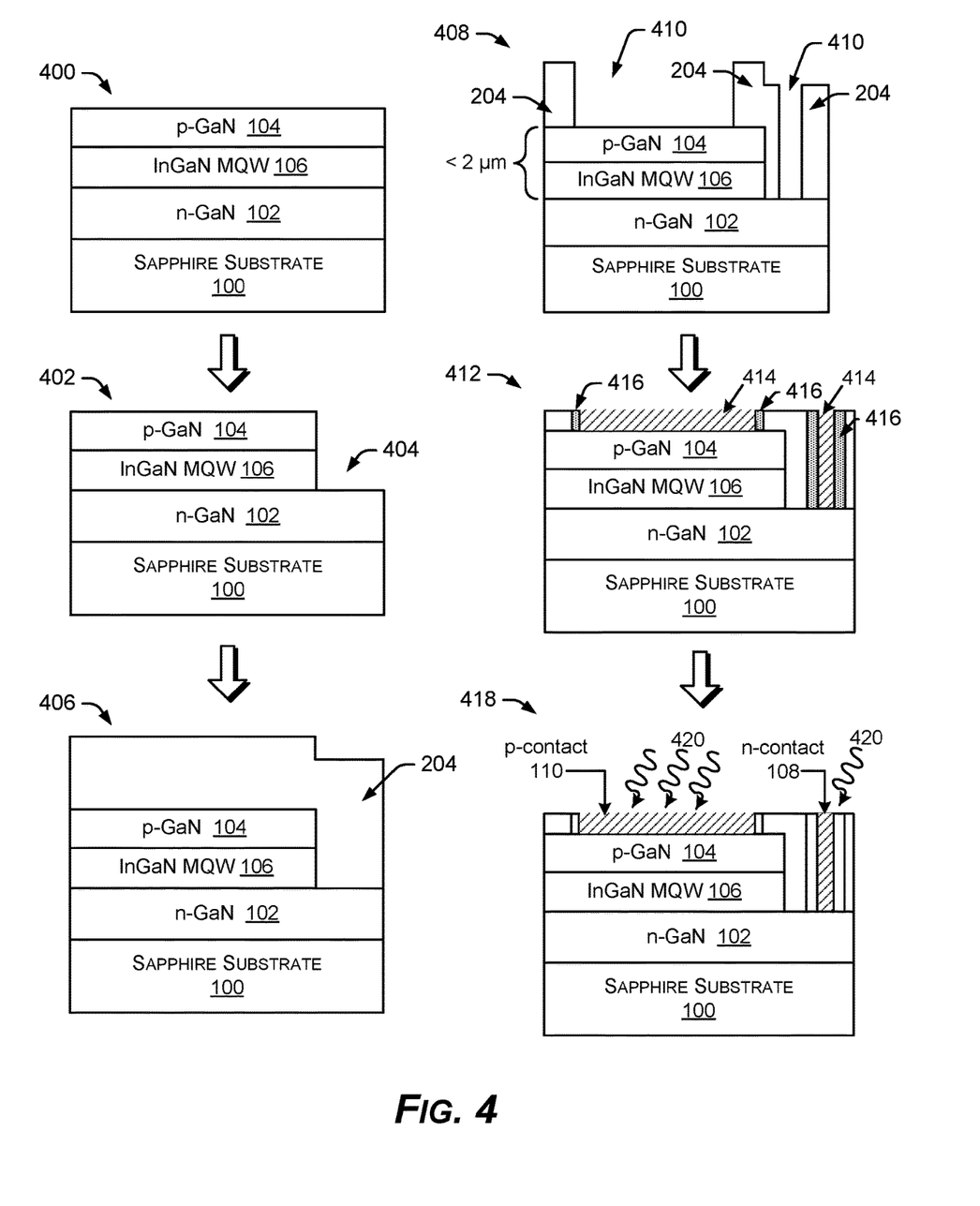
FIG. 4 is a diagram of an example process of fabricating the LED structure of FIG. 2.

FIG. 4 shows stages of example structure fabrication, illustrating an example process flow for making an LED structure 200 suitable for direct-bonding with a silicon driver ICs 304, for example.

In a first stage 400 of the example process flow, an example wafer, such as a sapphire substrate 100, is built up with beginning epitaxial layers of n-GaN 102, InGaN MQW 106, and p-GaN 104.

In a second stage 402 of the example process flow, the top epitaxial layers are patterned and etched to expose the n-GaN layer 102 at specific locations 404. Although the single exposed location 404 is shown at the edge at the die, there may be more than one location. For example, one or more through-vias may expose the n-GaN layer 102. The patterning resist can be left on.

In a third 406 stage of the example process flow, an insulator or dielectric, such as a silicon oxide layer 204 is deposited to cover both the exposed p-GaN 104 and the exposed n-GaN 102, at least at the location of the contacting pads.

In a fourth stage 408 of the example process flow, the silicon oxide layer 204 is patterned and etched over the p-GaN 104 and n-GaN 102 layers to make cavities 410 through the silicon oxide 204 for conductive metals to become the electrodes of the LED structure 200. In an implementation, the total thickness of the p-GaN 104 layer and the MQW 106 layer is approximately 2 μm, making the structure at this stage suitable for one-step etching and metallization (MQW layer 106 not shown to scale). One or more of such cavities 410 can be formed to form one or more electrodes contacting the n-GaN 102 layer and the p-GaN 104 layer.

In an alternative implementation, the example process deposits a flat silicon oxide layer 204 as in the third stage 406 above, then bonds this oxide surface directly with the driving chip(s) 304 using a ZiBond® brand direct-bonding process, or other direct bonding technique. Then, through-silicon-vias (TSVs) are drilled to create the electrical connectivity from the n contact 108 and the p contact 110 to the driver chip 304.

In a fifth stage 412 of the example process flow, the cavities 410 can be metalized with a conductive material 414. In an implementation, barrier and seed layer coatings 416 may be applied and formed, then cavities filled with the conductor 414, followed by annealing, and chemical-mechanical planarization (CMP). In an implementation, a low melting temperature metal, such as indium, may be coated in the cavities.

In a sixth stage 418 of the example process, a top surface of the example LED structure 200 is plasma-activated 420 for the direct-bonding operation. Plasma-activation 420 may be optional for some types of direct-bonding techniques, while in others, the plasma-activation step 420 enhances the bond strength between two metal surfaces, for example, during contact bonding. Plasma-activation 420 may also be applied to the opposing surfaces to be bonded on the driver chip(s) 304.

In various implementations, the example process flow depicted in FIG. 4 may include picking and transferring many small LED chips with high throughput, and direct-bonding at very fine pitch, for example at a pitch of less than 1 mm (even smaller pitch for making micro-projectors), and at a 0.05 mm spacing, and in various implementations all the way down to a 12 um pitch with 6 um bump. The pixel array optics achieve high parallelity of the LED dies 200 to the Si dies 304. Post-processing, such as thinning and laser liftoffs, can be accomplished because the direct-bonding applied results in the flat topography and strong bonding interfaces achieved.

FIGS. 5-9 show an example process for creating a thin, transparent, and flexible mLED array display 500, in which a wafer 502 with the LED structures 200 made by the process of FIG. 4 are now bonded to (for example) a CMOS driver chip wafer 504 to make the transparent and flexible array display 500.

Figure 5:
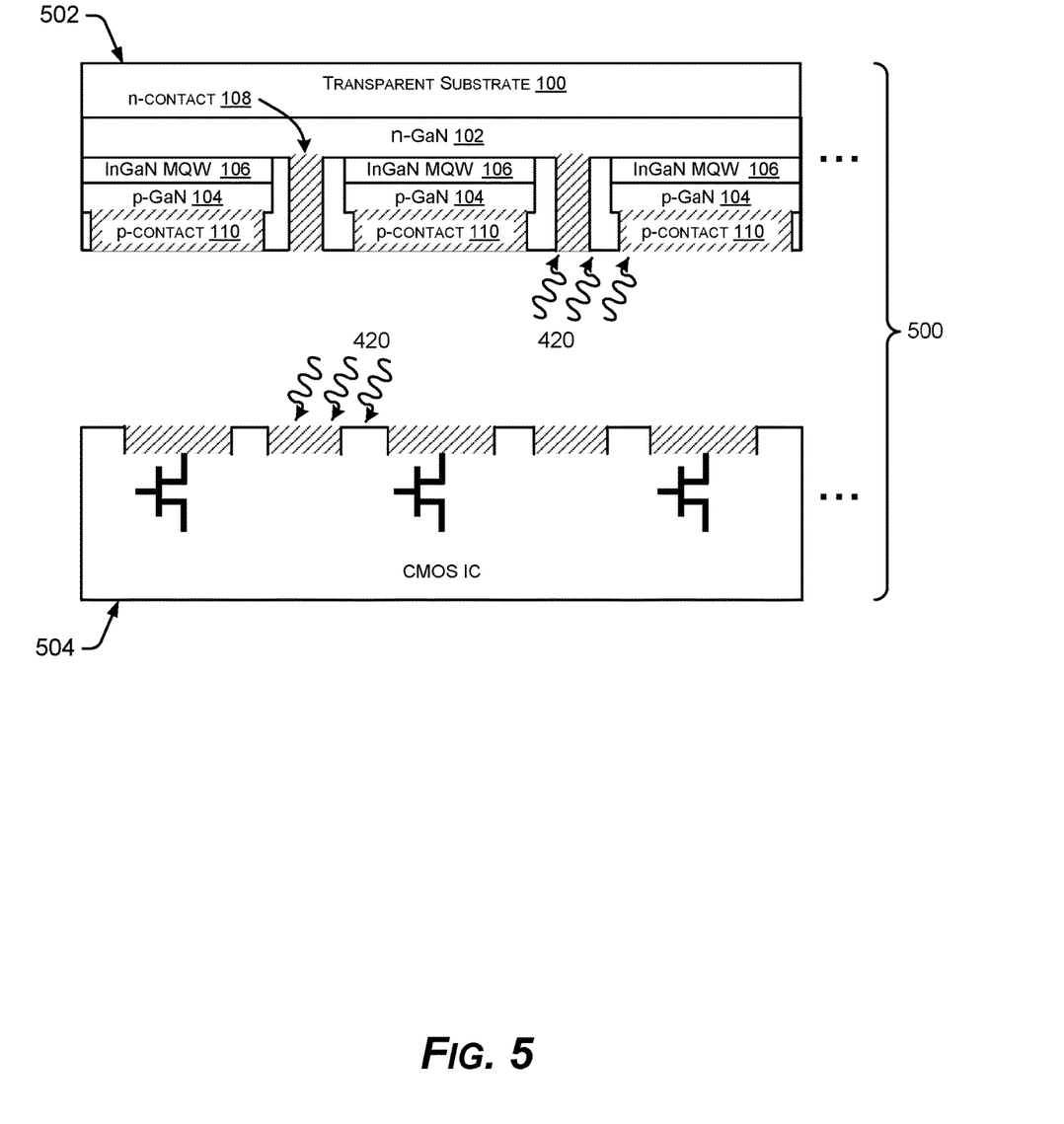
FIG. 5 is a diagram of a first stage of fabricating an example LED array display.

In FIG. 5, in an implementation, after the flat and activated surface on the LED device wafer 502 is formed, the CMOS wafer 504 is planarized with CMP or other means of obtaining an ultra-flat surface, and plasma-activated 420.

Figure 6:
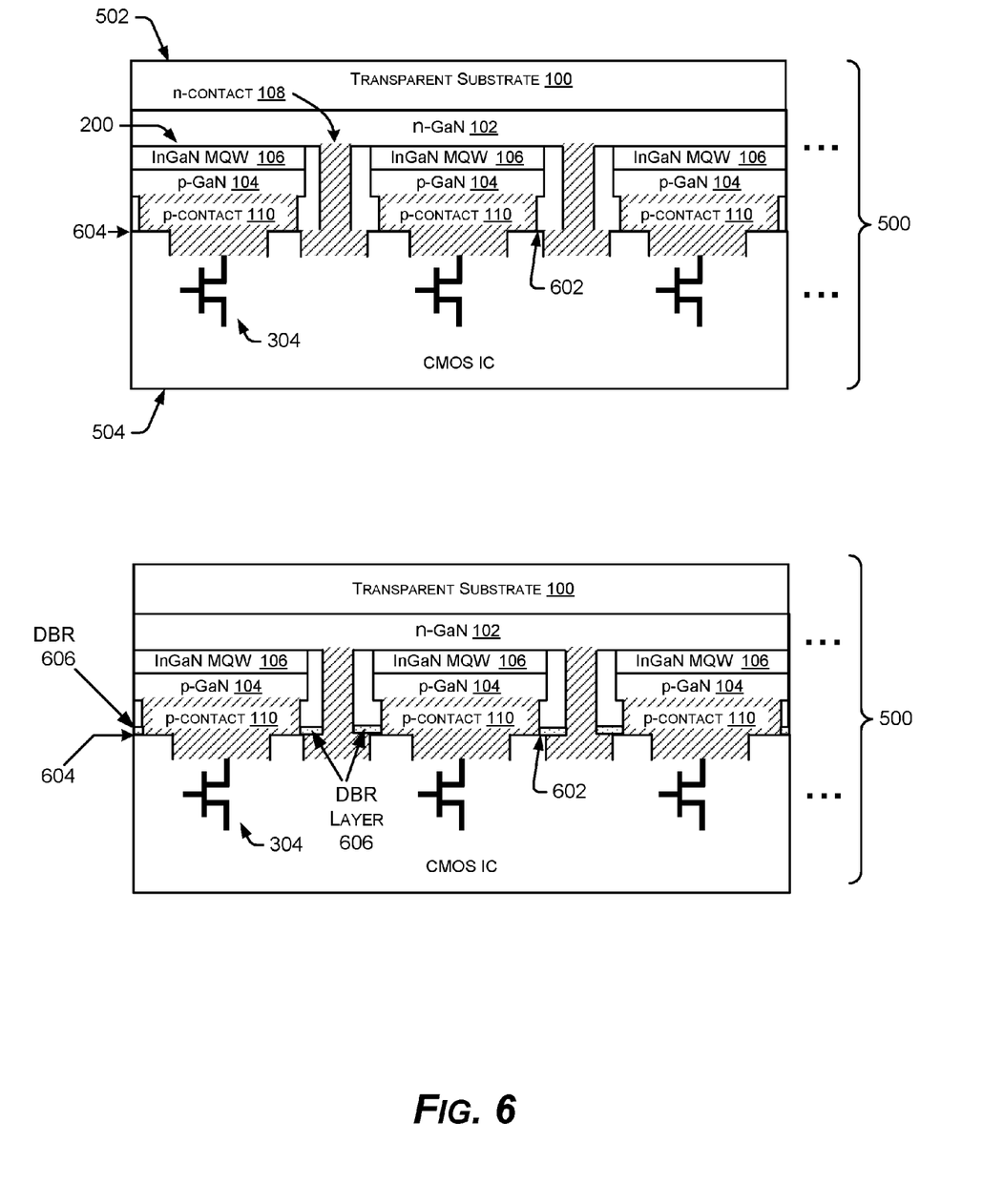
FIG. 6 is a diagram of a second stage of fabricating the example LED array display.

In FIG. 6, the two wafers 502 & 504 are bonded. For example, the first wafer 502 with the LED structures 200 and with coplanar bonding surfaces of the n contacts 108 and p contacts 110, and the second wafer 504 with CMOS driver chips 304, are brought together for direct-bonding between metallic conductors and in an implementation, between nonmetallic dielectric surfaces 602 also. Exposed silicon oxide of the first wafer 502 in contact with exposed silicon oxide of the second wafer 504 bonds first through oxide bonding, as with a ZiBond® brand direct-bonding process. The metal contact pads of the respective wafers 502 & 504 form a metal-to-metal bond during higher-than-room-temperature annealing, as with a DBI® brand direct-bonding process. The bonding interface 604 may be annealed at approximately 100-200° C. to form a strong direct bond interface, such as the ZiBond® or DBI® brand direct-bond interface.

An optical reflective coating, such as distributed Bragg reflector (DBR) 606 (not shown to relative scale), can be deposited to increase light output of the package by choosing different types and thickness of the dielectric layers on top of wafer 502 at the interface (606) between the first wafer 502 and the second wafer 504. Alternatively, the DBR 606 could also be formed on top of the second wafer 504 prior to bonding. In this orientation of a DBR 606, light can escape from the sapphire side of the device. If DBRs 606 are formed on the first wafer 502, then the thin dielectrics need to be deposited at the end of the second stage 402 or the third stage 406 of the process shown in FIG. 4. The DBR 606 is a structure formed from multiple layers of alternating materials with varying refractive index, or by periodic variation of some characteristic, for example, thickness of the dielectrics, resulting in periodic variation in the effective refractive index. These thin layers of dielectric coatings may be the combination of silicon oxide, magnesium fluoride, tantalum pentoxide, zinc sulfide, and titanium dioxide, for example. A silicon oxide SiOx layer on a top surface of the compound wafer 502 can also serve as the last of the coatings which is then bonded directly with direct bonding techniques, such as a ZiBond® or a DBI® process, to wafer 504.

In another embodiment, DBR may be formed at between sapphire and n-GaN. In this orientation, the light will be reflected towards CMOS wafer 504. However, less amount of light will escape as CMOS chip would be obstructing the escape route.

Figure 7:
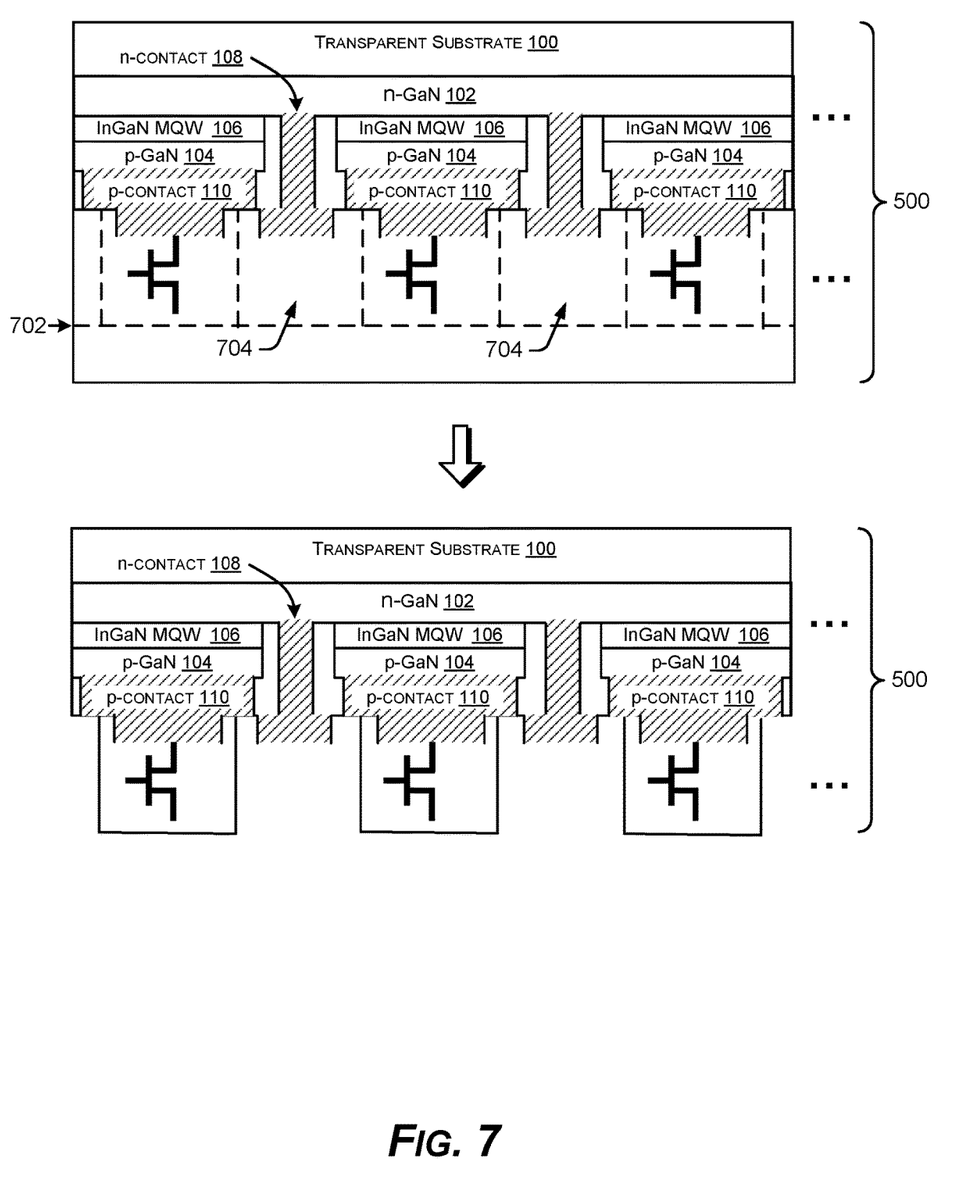
FIG. 7 is a diagram of a third stage of fabricating the example LED array display.

In FIG. 7, the thin-film transistor (TFT) backplane can be thinned 702, which can be facilitated by a ZiBond® brand direct-bonding process. Then the non-transistor parts 704 of the thinned backplane can also be etched away. In this embodiment, the location of one or more n-contacts 108 and p-contacts 110 can be designed such that they may be exposed from the backside after etching of the backplane; and hence can be contacted for power delivery from the back side.

Figure 8:
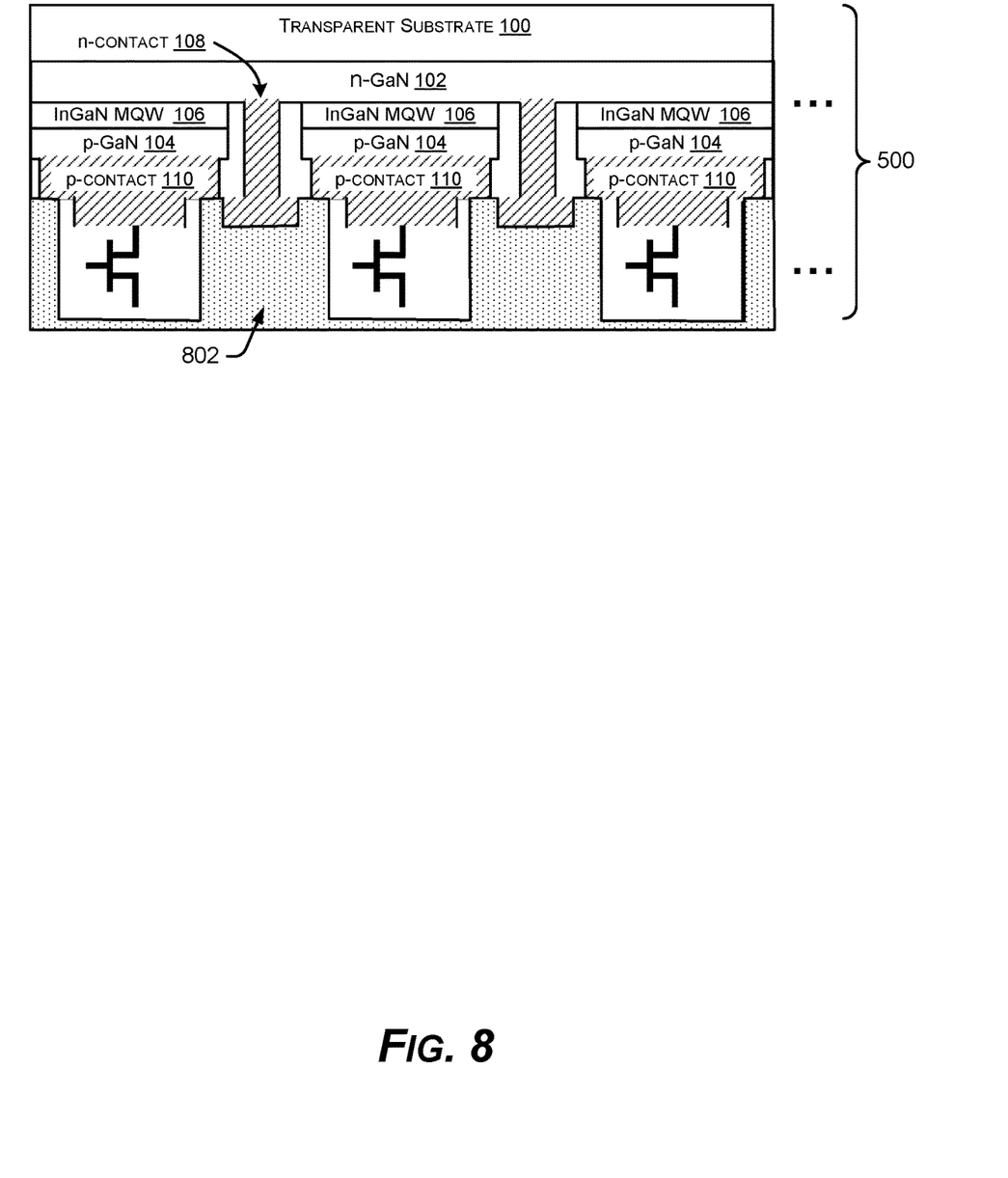
FIG. 8 is a diagram of a fourth stage of fabricating the example LED array display.

In FIG. 8, the thinned and etched transistor surface may be coated with a polyimide (PI) layer 802 or any other dielectric material for protection.

Figure 9:
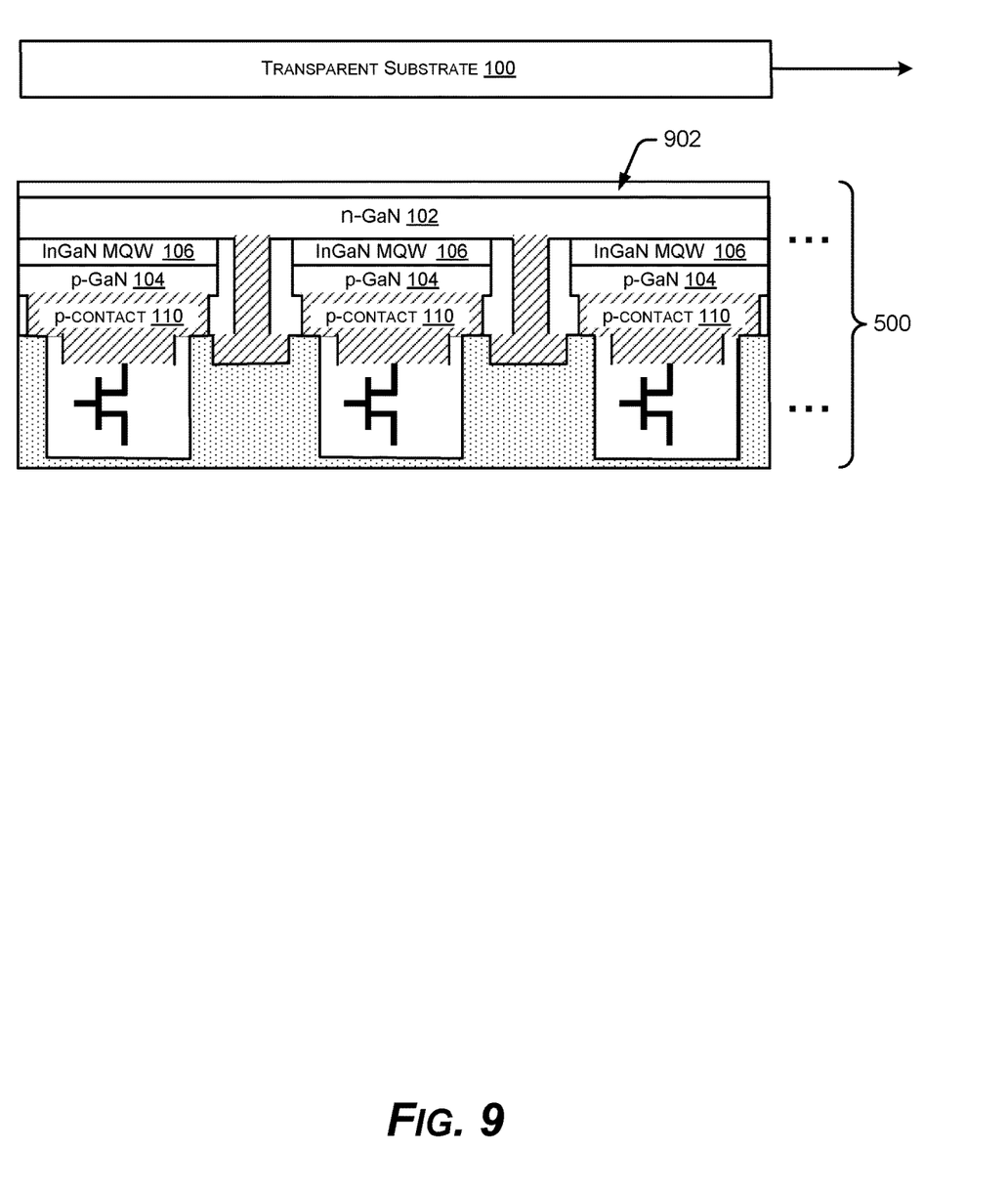
FIG. 9 is a diagram of a fifth stage of fabricating the example LED array display.

In FIG. 9, a laser-lift-off of the sapphire substrate layer 100 may be performed, and this exposed side of the wafer 502 then coated with a flexible organic substrate 902.

In another embodiment, the process to etch and backfill by the transistor backplane by PI may be skipped before a laser-lift-off of the sapphire substrate layer 100. In this embodiment, one or more through-electrodes may be needed in the backplane for power delivery to the electrodes.

Figure 10:
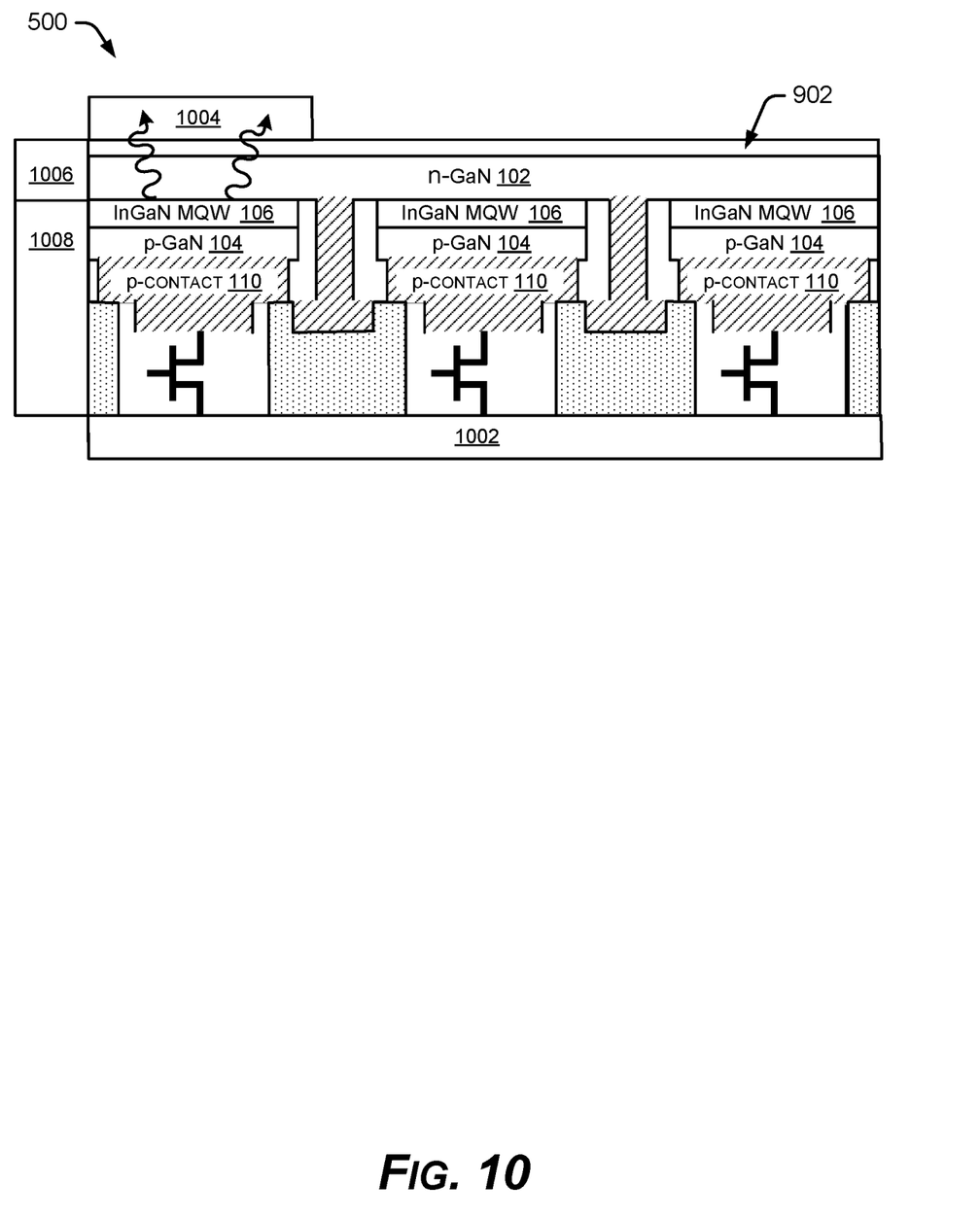
FIG. 10 is a diagram of a completed LED array display and optional components.

FIG. 10 shows operational access available on all sides of example transparent and flexible mLED array displays 500 created with direct-bonding. This versatility is due at least in part to the strong bonds possible with direct bonding, such as DBI® and ZiBond® brand bonding processes, which result in a final structure able to tolerate further processing on multiple sides of the structure 500. For example, besides lifting off the transparent (e.g., sapphire) substrate 100 to make a flexible display 500 bonded to a flexible organic substrate 902, post grinding may be applied and further lift-off performed to make the display thinner, more transparent, and more flexible.

The backside of the mLED array display 500 may be added onto with backside build-up layers 1002 for further 3D integration to attach to memory, printed circuit boards (PCBs), tactile and other sensors, and so forth.

One or more optical waveguides 1004 may be integrated on top of the transparent substrate 902 to transmit optical signals from the LED elements, and also lines for electrical signals may be added. In an implementation, the one or more optical waveguides 1004 are attached to the example LED array display 500 by a direct-bonding technique.

On the sides of the example mLED array display 500, an edge emitting configuration 1006 may be added, and/or optical waveguides on the sides, similar to the one or more optical waveguides 1004 on top. In this embodiment, reflectors may be needed on both sides of the LED devices 200, at layer 902, as well as at the direct-bond (e.g., ZiBond®) interface 604/606.

The structure of the example mLED array display 500 enables multi-junction stacking of compound semiconductors, for solar cells and solar panels, for example.

The sides of the example mLED array display 500 can also accommodate cooling structures 1008.

After removing sapphire layer 100, as in FIG. 8, the surface may be roughened and indium tin oxide (ITO) added to improve the electrical conductivity of the LEDs.

The example steps just described and illustrated above provide direct-bonded light emitting diode (LED) arrays 500, for example arrays of mLEDs, wherein group III-V semiconductor elements are direct-bonded to LED driver circuitry, in wafer-level processes, for example. The arrays 500, made through a direct-bonding process, may be flexible, and possess an optically transparent surface.

In general, the example compound semiconductor-based LED array devices 500 are made with a flat surface composed of coplanar metal regions and dielectric regions. The coplanar metal regions are electrically connected to the active regions of the compound semiconductors of each LED element.

The above compound semiconductor-based LED array structures 500 may include bonds to a CMOS based device connected in a direct-bonding manner. The metal regions and the dielectric regions of the compound semiconductor-based LED array device 500 may be bonded directly to the respective metal regions and dielectric regions of the CMOS based device. Although described with respect to a wafer level process, the example process of FIGS. 5-9 can be used not only for wafer-to-wafer (W2W) processes, but also die-to-die (D2D), or one or multiple dies-to-wafer (D2W) processes.

The resulting example LED array structures 500 may also have other characteristics and features:

The resulting LED array structures 500 may have an absence of substrate where the group III-V-based semiconductor light-emitting devices are grown. Further, a surface of the microstructure of the group III-V semiconductor-based light-emitting devices can be advantageously roughened for improved light extraction.

The electrode shape for electrically connecting to the n-GaN 102 and p-GaN 104 active regions via a direct-bonding process, such as a DBI® brand direct-bonding process, can be specially designed, such as frame-traced dot arrays for the electrode or contact 108 of the n-GaN 102 region, and a dot array in a circular or square area for the electrode or contact 110 of the p-GaN 104 region.

Example Processes

Figure 11:
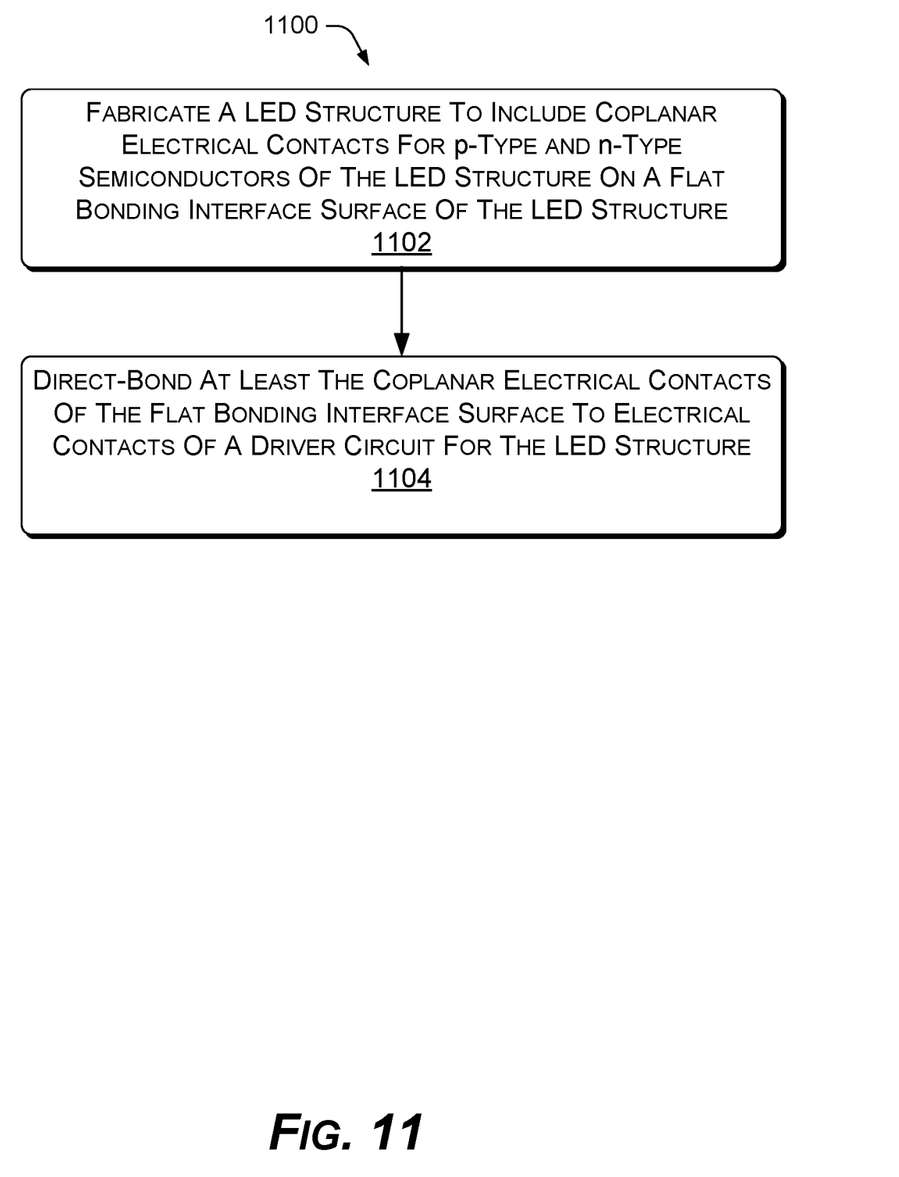
FIG. 11 is a block diagram of an example process of making a direct-bonded LED structure.

FIG. 11 shows an example method 1100 of making a direct-bonded LED structure. In the flow diagram, operations of the example method 1100 are shown in individual blocks.

At block 1102, a LED structure is fabricated with electrical contacts to p-type and n-type semiconductor elements coplanar on a first surface comprising a flat bonding interface of the LED structure.

At block 1104, the first surface is direct-bonded to a second surface comprising a flat bonding interface of a driver circuit for the LED structure.

The direct-bonding operation used in the example method 1100, such as a ZiBond® or a DBI® brand direct-bonding process, may be applied in a wafer level, single chip-level, or a chip array-level process.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A process, comprising:
fabricating an array of LED structures, wherein each LED structure includes coplanar electrical contacts for p-type and n-type semiconductors on a first bonding surface; and
direct-bonding at least the coplanar electrical contacts of the first bonding surfaces of the array of LED structures to electrical contacts located on a substrate, wherein the electrical contacts on the substrate are in communication with a driver circuit within the substrate to individually control each LED structure in the array of LED structures.

2. The process of claim 1, further comprising direct-bonding at least the coplanar electrical contacts of the first bonding surfaces of the array of LED structures to electrical contacts of an array of driver circuits.

3. The process of claim 2, wherein each LED structure in the array of LED structures and each connection to an instance of a driver circuit in the array of driver circuits are in a 1:1 ratio.

4. The process of claim 2, wherein each LED structure has an illumination area approximately a size of a pixel of a video display.

5. The process of claim 4, wherein the video display comprises a high-resolution video display.

6. The process of claim 2, wherein each LED structure has an illumination area approximately a size of a smallest controllable element of an image represented on a display.

7. The process of claim 2, wherein the LED structures in the array of LED structures comprise micro-LEDs, each micro-LED having an illumination area approximately a size of a pixel of a high-resolution video display, or an illumination area approximately a size of a smallest controllable element of an image represented on the high-resolution video display.

8. The process of claim 1, further comprising direct-bonding a first chip comprising the LED structures with coplanar electrical contacts with a second chip comprising the electrical contacts in communication with a driver circuit for the array of the LED structures.

9. A process, comprising:
building semiconductor layers of LED structures on a first substrate;
patterning the first substrate with a resist and etching the first substrate to expose an n-type semiconductive layer of each LED structure;
depositing a silicon oxide layer to cover both a p-type semiconductive layer and the exposed n-type semiconductive layer of each LED structure;
patterning and etching the silicon oxide over the p-type semiconductive layer and the n-type semiconductive layer of each LED structure to form cavities in the silicon oxide down to the surfaces of the p-type semiconductive layer and the n-type semiconductive layer of each LED structure;
metalizing the cavities in the silicon oxide;
planarizing the silicon oxide and the metalized cavities to make a flat bonding surface with coplanar contacts of the p-type semiconductive layer and the n-type semiconductive layer of each LED structure;
plasma-activating a surface of the first substrate;
bonding the activated surface to a second substrate; and
annealing the bonded substrate to make a direct-bonded LED array display.

10. The process of claim 9, wherein each LED structure of the first substrate is direct-bonded to a conductive contact of the second substrate, wherein metal regions and dielectric regions of each LED structure on the first substrate are direct-bonded to respective metal regions and dielectric regions of the second substrate.

11. The process of claim 9, further comprising thinning a thin-film transistor (TFT) backplane of the direct-bonded LED array display.

12. The process of claim 11, further comprising coating the thinned backplane with a polyimide (PI) layer for protection.

13. The process of claim 12, further comprising removing the first substrate through a laser-lift-off process and coating the remaining surface with a flexible organic substrate, to make a transparent and flexible direct-bonded LED array display.

14. A process, comprising:
forming semiconductor layers of LED structures on a surface of a first substrate;
forming an exposed n-type semiconductive layer of each LED structure within the semiconductor layers of each LED structure;
forming an exposed p-type semiconductive layer of each LED structure within the semiconductor layers of each LED structure;
forming a planarized damascene layer with coplanar damascene conductive areas respectively contacting the exposed n-type semiconductive layer and the exposed p-type semiconductive layer of each LED structure; and
bonding the coplanar damascene conductive areas to a surface of a second substrate.

15. The process of claim 14, further comprising:
plasma-activating the planarized damascene layer before the bonding to the surface of the second substrate, wherein the bonding comprises a direct-bonding process; and
after the direct-bonding process, annealing the direct-bonded damascene layer to finish the direct-bonding process.

16. The process of claim 14, wherein the coplanar damascene conductive areas for contacting the exposed n-type semiconductive layer and the exposed p-type semiconductive layer of a single LED structure are within a horizontal planar footprint of the single LED structure.

17. The process of claim 14, wherein forming the semiconductor layers of LED structures on the surface of the first substrate comprises forming an array of micro-LEDs.

18. The process of claim 17, wherein forming the micro-LEDs comprises forming micro-LED structures having an illumination area approximately a size of a pixel of a high-resolution video display, or an illumination area approximately a size of a smallest controllable element of an image represented on the high-resolution video display.

19. The process of claim 17, wherein forming the micro-LED structures comprises forming a contiguous semiconductor doped layer to provide active regions for multiple micro-LED structures in the array.

20. The process of claim 17, further comprising:
bonding the coplanar damascene conductive areas to an array of driver circuits, wherein each micro-LED is individually controlled by the array of driver circuits.

21. The process of claim 20, wherein the array of micro-LEDs and the array of driver circuits are direct hybrid bonded together through oxide-to-oxide direct bonds between respective dielectric areas and through metal-to-metal direct bonds between the coplanar damascene conductive areas and conductive areas of the second surface.

22. The process of claim 14, further comprising:
thinning a thin-film transistor (TFT) backplane of the bonded surfaces; and
coating the thinned backplane with a polyimide (PI) layer for protection.

23. The process of claim 22, further comprising:
removing the substrate through a laser-lift-off process and coating a surface exposed by the laser-lift-off process with a flexible organic substrate, to make a transparent and flexible direct-bonded micro-LED array.

* * * * *